(12) United States Patent
Kang et al.

(10) Patent No.: US 8,845,856 B2
(45) Date of Patent: Sep. 30, 2014

(54) EDGE RING ASSEMBLY FOR PLASMA ETCHING CHAMBERS

(75) Inventors: Michael S. Kang, San Ramon, CA (US); Michael C. Kellogg, Pleasanton, CA (US); Migùel A. Saldana, Fremont, CA (US); Travis R. Taylor, Fremont, CA (US)

(73) Assignee: Lam Research Corporation, Fremont, CA (US)

( * ) Notice: Subject to any disclaimer, the term of this patent is extended or adjusted under 35 U.S.C. 154(b) by 728 days.

(21) Appl. No.: 12/957,932

(22) Filed: Dec. 1, 2010

(65) Prior Publication Data

US 2011/0126984 A1 Jun. 2, 2011

Related U.S. Application Data

(60) Provisional application No. 61/265,510, filed on Dec. 1, 2009.

(51) Int. Cl.
*H01L 21/3065* (2006.01)
*H01J 37/32* (2006.01)

(52) U.S. Cl.
CPC ..... *H01J 37/32642* (2013.01); *H01J 37/32091* (2013.01)
USPC .............. 156/345.51; 156/345.4; 156/345.41; 156/345.42; 156/345.43; 156/345.44; 156/345.45; 156/345.46; 156/345.47; 156/345.48; 156/345.49

(58) Field of Classification Search
USPC .............. 156/345.51, 345.4, 345.41, 345.42, 156/345.43, 345.44, 345.45, 345.46, 156/345.47, 345.48, 345.49
See application file for complete search history.

(56) References Cited

U.S. PATENT DOCUMENTS

| | | | |
|---|---|---|---|
| 4,340,462 A | 7/1982 | Koch | |
| 4,948,458 A | 8/1990 | Ogle | |
| 5,200,232 A | 4/1993 | Tappan et al. | |
| 5,805,408 A | 9/1998 | Maraschin et al. | |
| 5,820,723 A | 10/1998 | Benjamin et al. | |
| 5,824,605 A | 10/1998 | Chen et al. | |
| 5,948,704 A | 9/1999 | Benjamin et al. | |
| 5,998,932 A | 12/1999 | Lenz | |

(Continued)

OTHER PUBLICATIONS

Search Report and Written Opinion dated Sep. 26, 2011 for Singapore Patent Appln. No. 201008912-6.

(Continued)

*Primary Examiner* — Sylvia R MacArthur
(74) *Attorney, Agent, or Firm* — Buchanan Ingersoll & Rooney PC

(57) ABSTRACT

An edge ring assembly used in a plasma etching chamber includes a dielectric coupling ring and a conductive edge ring. In one embodiment, the dielectric coupling ring has an annular projection extending axially upward from its inner periphery. The dielectric coupling ring is adapted to surround a substrate support in a plasma etching chamber. The conductive edge ring is adapted to surround the annular projection of the dielectric coupling ring. A substrate supported on the substrate support overhangs the substrate support and overlies the annular projection of the dielectric coupling ring and a portion of the conductive edge ring. In another embodiment, the dielectric coupling ring has a rectangular cross section. The dielectric coupling ring and the conductive edge ring are adapted to surround a substrate support in a plasma etching chamber. A substrate supported on the substrate support overhangs the substrate support and overlies a portion of the conductive edge ring.

6 Claims, 8 Drawing Sheets

(56) References Cited

U.S. PATENT DOCUMENTS

| | | |
|---|---|---|
| 6,013,155 A | 1/2000 | McMillin et al. |
| 6,013,984 A | 1/2000 | Ellinger et al. |
| 6,039,836 A | 3/2000 | Dhindsa et al. |
| 6,090,304 A | 7/2000 | Zhu et al. |
| 6,140,612 A | 10/2000 | Husain et al. |
| 6,230,651 B1 | 5/2001 | Ni et al. |
| 6,333,272 B1 | 12/2001 | McMillin et al. |
| 6,383,931 B1 | 5/2002 | Flanner et al. |
| 6,554,954 B2 | 4/2003 | Ma et al. |
| 6,824,627 B2 | 11/2004 | Dhindsa et al. |
| 7,244,336 B2 | 7/2007 | Fischer et al. |
| 2009/0186487 A1 | 7/2009 | Chang et al. |
| 2011/0126984 A1* | 6/2011 | Kang et al. ............... 156/345.51 |

OTHER PUBLICATIONS

Search and Examination Report dated May 15, 2012 for Singapore Appln. No. 201008912-6.

* cited by examiner

EDGE RING ASSEMBLY FOR PLASMA ETCHING CHAMBERS

This application claims priority under 35 U.S.C. §119 to U.S. Provisional Application No. 61/265,510 entitled AN EDGE RING ASSEMBLY FOR PLASMA ETCHING CHAMBERS, filed Dec. 1, 2009, the entire content of which is hereby incorporated by reference.

BACKGROUND

Plasma etching chambers are commonly used to etch one or more layers formed on a semiconductor substrate. During etching, the substrate is supported on a substrate support within the chamber. A substrate support typically includes a clamping mechanism. Edge rings can be disposed around the substrate support (i.e., around the substrate) for confining plasma to the space above the substrate and/or to protect the substrate support from erosion by the plasma. The edge rings, sometimes called focus rings, can be sacrificial (i.e., consumable) parts. Conductive and non-conductive edge rings are described in commonly-owned U.S. Pat. Nos. 5,805,408; 5,998,932; 6,013,984; 6,039,836 and 6,383,931.

Lithographic techniques can be used to form geometric patterns in a surface of the substrate. During a lithographic process, a pattern such as an integrated circuit pattern can be projected from a mask or reticle and transferred to a photosensitive (e.g., photoresist) coating formed on the surface of the substrate. Plasma etching, in turn, can be used to transfer the pattern formed in the photoresist layer to one or more layers formed on the substrate that underlie the photoresist layer.

During plasma etching, plasma is formed above the surface of the substrate by supplying radio-frequency (RF) electromagnetic radiation to a low pressure gas (or gas mixture). By adjusting the electrical potential of the substrate, charged species in the plasma can be directed to impinge upon the surface of the substrate and thereby remove material (e.g., atoms) therefrom.

Plasma etching can be made more effective by using gases that are chemically reactive with the material to be etched. So called "reactive ion etching" combines the energetic impinging effects of the plasma with the chemical etching effects of a reactive gas.

An etching byproduct may undesirably deposit on a lateral edge (e.g., bevel edge) or underside of the substrate. The byproduct deposition, which may be volatilized during subsequent processing, may have an adverse effect on process yield. In order to maximize yield, reduction in polymer buildup at the underside and on the bevel edge of the substrate would be desirable.

SUMMARY

Described herein is an edge ring assembly used in a plasma etching chamber, the edge ring assembly including a dielectric coupling ring adapted to surround a substrate support in the plasma etching chamber, and a conductive edge ring supported on the dielectric coupling ring such that a substrate supported on the substrate support overhangs a portion of the conductive edge ring.

DETAILED DESCRIPTION

In a parallel plate plasma etching chamber wherein process gas is supplied through a showerhead electrode and a semiconductor substrate supported on a substrate support is etched by plasma generated by supplying RF energy through the showerhead and/or substrate support, plasma uniformity can be affected by RF coupling between the substrate support and the plasma.

To improve the plasma uniformity, an edge ring assembly can be configured to surround the substrate support in the plasma etching chamber. The edge ring assembly comprises a conductive edge ring and a dielectric coupling ring arranged such that the dielectric coupling ring surrounds the substrate support and the conductive edge ring is supported on the dielectric coupling ring. The conductive edge ring can decrease byproduct deposition at the underside and along the edge of the substrate, increase plasma etching uniformity of the substrate, and/or reduce wear of plasma etching chamber components. The dielectric coupling ring can be functional to reduce RF coupling and undesirable arcing between the conductive edge ring and the substrate support.

The edge ring assembly can be incorporated in inductively coupled, helicon, electron cyclotron resonance, parallel plate, or other types of plasma etching chambers. For instance, high density plasma can be produced in a transformer coupled plasma (TCP™) reactor, or in an electron cyclotron resonance (ECR) reactor. Transformer coupled plasma reactors, wherein RF energy is inductively coupled into the reactor, are available from Lam Research Corporation, Fremont, Calif. An example of a high-flow plasma reactor that can provide high density plasma is disclosed in commonly-owned U.S. Pat. No. 5,948,704, the disclosure of which is hereby incorporated by reference. Parallel plate reactors, electron-cyclotron resonance (ECR) reactors, and transformer coupled plasma (TCP™) reactors are disclosed in commonly-owned U.S. Pat. Nos. 4,340,462; 4,948,458; 5,200,232 and 5,820,723, the disclosures of which are hereby incorporated by reference.

By way of example, plasma can be produced in a parallel plate etching chamber such as the dual frequency plasma etching chamber described in commonly-owned U.S. Pat.

No. 6,090,304, the disclosure of which is hereby incorporated by reference. A preferred parallel plate plasma etching chamber is a dual frequency capacitively coupled plasma reactor including an upper showerhead electrode and a substrate support. For purposes of illustration, embodiments of the edge ring assembly are described herein with reference to a parallel plate type plasma etching chamber.

Figure 1:
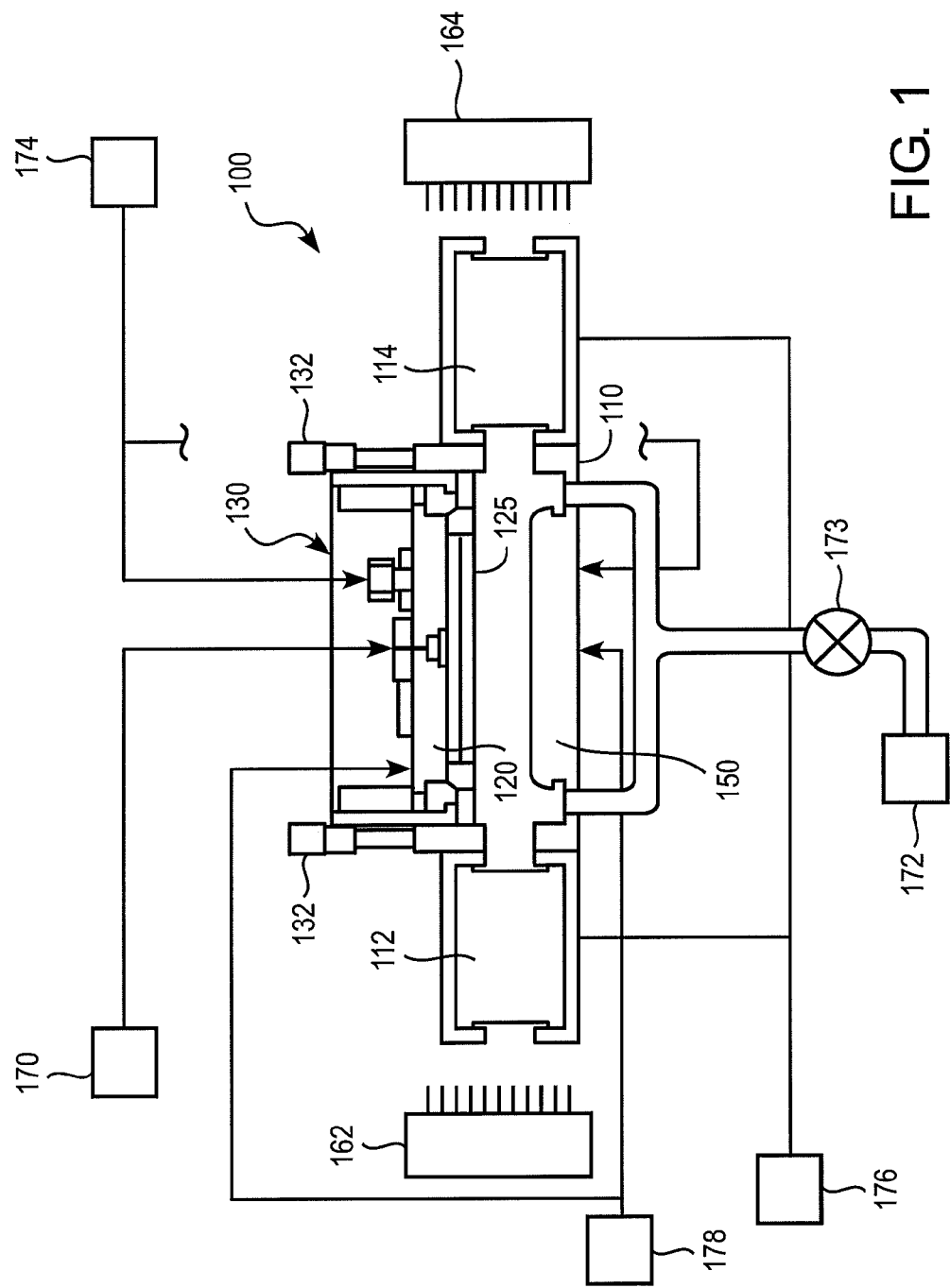
FIG. 1 is an illustration of a parallel plate plasma etching chamber.

A parallel plate plasma etching chamber is illustrated in FIG. 1. The plasma etching chamber 100 comprises a chamber 110, an inlet load lock 112, and an optional outlet load lock 114, further details of which are described in commonly-owned U.S. Pat. No. 6,824,627, which is hereby incorporated by reference in its entirety.

The load locks 112 and 114 (if provided) include transfer devices to transfer substrates such as wafers from a wafer supply 162, through the chamber 110, and out to a wafer receptacle 164. A load lock pump 176 can provide a desired vacuum pressure in the load locks 112 and 114.

A vacuum pump 172 such as a turbo pump is adapted to maintain a desired pressure in the chamber. During plasma etching, the chamber pressure is controlled, and preferably maintained at a level sufficient to sustain a plasma. Too high a chamber pressure can disadvantageously contribute to etch stop while too low a chamber pressure can lead to plasma extinguishment. In a medium density plasma reactor, such as a parallel plate reactor, preferably the chamber pressure is maintained at a pressure below about 200 mTorr (e.g., less than 100 mTorr or less than 50 mTorr) ("about" as used herein means ±10%).

The vacuum pump can be connected to an outlet in a wall of the reactor and can be throttled by a valve 173 in order to control the pressure in the chamber. Preferably, the vacuum pump is capable of maintaining a pressure within the chamber of less than 200 mTorr while etching gases are flowed into the chamber.

The chamber 110 includes an upper electrode assembly 120 including an upper electrode 125 (e.g., showerhead electrode), and a substrate support 150. The upper electrode assembly 120 is mounted in an upper housing 130. The upper housing 130 can be moved vertically by a mechanism 132 to adjust the gap between the upper electrode 125 and the substrate support 150.

An etching gas source 170 can be connected to the housing 130 to deliver etching gas comprising one or more gases to the upper electrode assembly 120. In a preferred etching chamber, the upper electrode assembly comprises a gas distribution system, which can be used to deliver reactant and/or carrier gases to a region proximate to the surface of a substrate. Gas distribution systems, which can comprise one or more gas rings, injectors and/or showerheads (e.g., showerhead electrodes), are disclosed in commonly-owned U.S. Pat. Nos. 6,333,272; 6,230,651; 6,013,155 and 5,824,605, the disclosures of which are hereby incorporated by reference.

The upper electrode 125 preferably comprises a showerhead electrode, which includes gas holes (not shown) to distribute etching gas therethrough. The showerhead electrode can comprise one or more vertically spaced-apart baffle plates that can promote the desired distribution of etching gas. The upper electrode and the substrate support may be formed of any suitable material such as graphite, silicon, silicon carbide, aluminum (e.g., anodized aluminum), or combinations thereof. A heat transfer liquid source 174 can be connected to the upper electrode assembly 120 and another heat transfer liquid source can be connected to the substrate support 150.

Figure 2A:
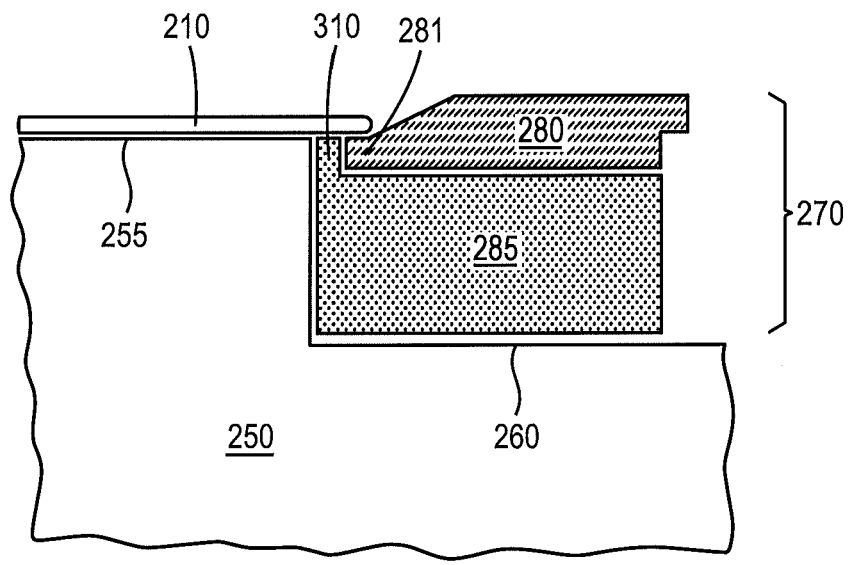
FIG. 2A shows an edge ring assembly mounted on a substrate support in a parallel plate plasma etching chamber, according to an embodiment.
Figure 2B:
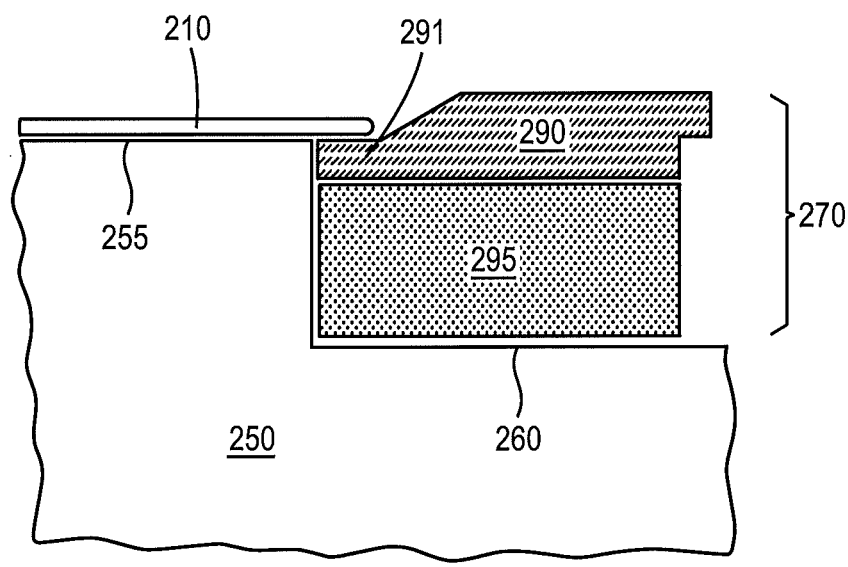
FIG. 2B shows an edge ring assembly mounted on a substrate support in a parallel plate plasma etching chamber, according to another embodiment.

FIGS. 2A and 2B show details of a substrate support 250, including an edge ring assembly 270 according to two embodiments, respectively. The substrate support 250 can incorporate an electrostatic chuck (ESC) (not shown) for electrostatically clamping a substrate on an upper surface 255 (support surface) of the substrate support 250. The substrate support 250 can be powered by an RF source and attendant circuitry (not shown) for providing RF matching, etc. The substrate support 250 is preferably temperature controlled and may optionally include a heating arrangement (not shown). The substrate support 250 is adapted to support a single semiconductor substrate such as a 200 mm or 300 mm wafer on the support surface 255.

The substrate support 250 preferably includes passages therein for supplying helium under the substrate 210 to cool the substrate 210 during plasma etching thereof in an amount sufficient to prevent burning of photoresist on the substrate. A method of controlling a temperature of a substrate by introducing a pressurized gas into a space between the substrate and the substrate support surface is disclosed in commonly-owned U.S. Pat. No. 6,140,612, the disclosure of which is hereby incorporated by reference.

As shown in the FIG. 2A embodiment, a dielectric coupling ring 285 is supported on a flange surface 260 of the substrate support 250, with or without mechanical or adhesive fastening. A conductive edge ring 280 is supported on an upper surface of the dielectric coupling ring 285. A projection 310 of the dielectric coupling ring 285 is disposed between the substrate support 250 and the conductive edge ring 280. A substrate 210 can be supported/clamped on the support surface 255. In order to reduce exposure of the substrate support 250 to the ions/reactive species in the plasma, the substrate support 250 is preferably sized such that the substrate 210 overhangs the substrate support surface 255 and the projection 310 and overlie at least a radially inner portion 281 of the conductive edge ring 280.

The conductive edge ring 280 can be made from a semi-conducting or electrically conductive material such as silicon (e.g., single crystal silicon or polycrystalline silicon) or silicon carbide (e.g., chemical vapor deposited silicon carbide). Due to direct exposure to the plasma, the conductive edge ring 280 is preferably made from high purity materials. The conductive edge ring 280 may be electrically floating or may be electrically coupled to a DC ground.

Figure 3:
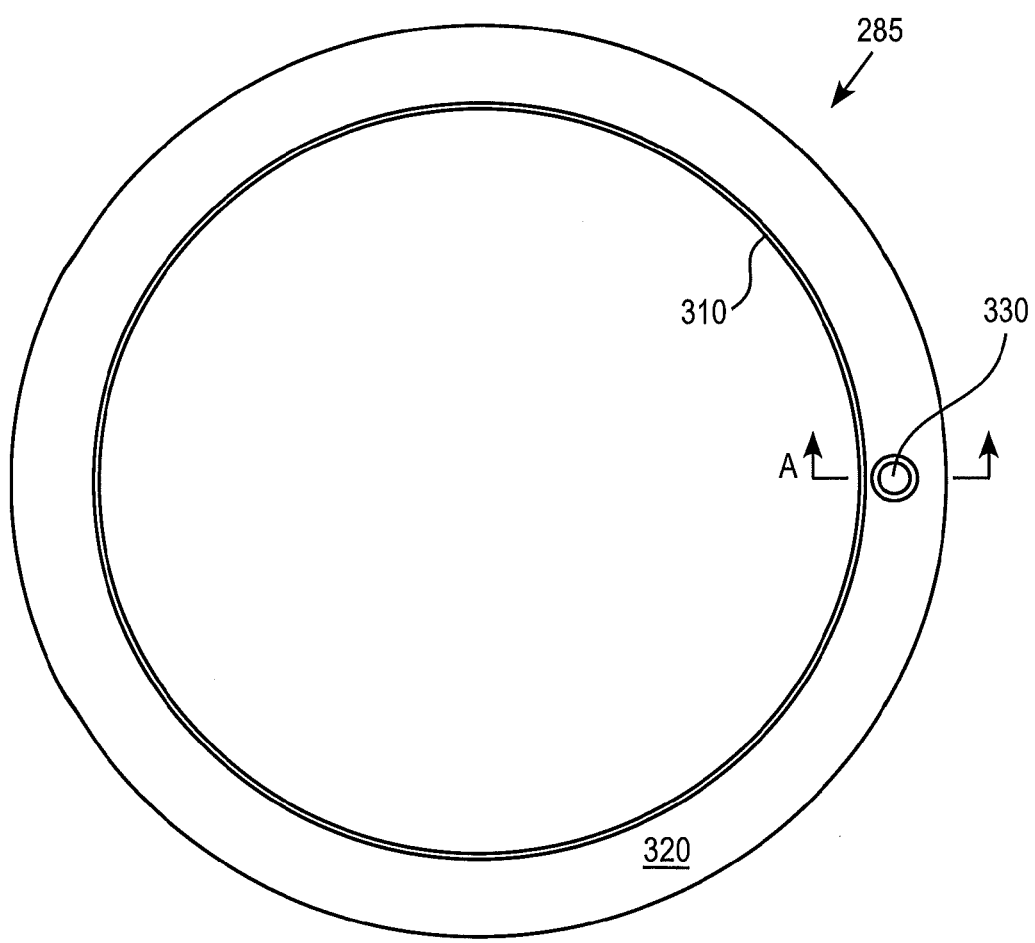
FIG. 3 shows a top view of a dielectric coupling ring as shown in FIG. 2A.
Figure 4:
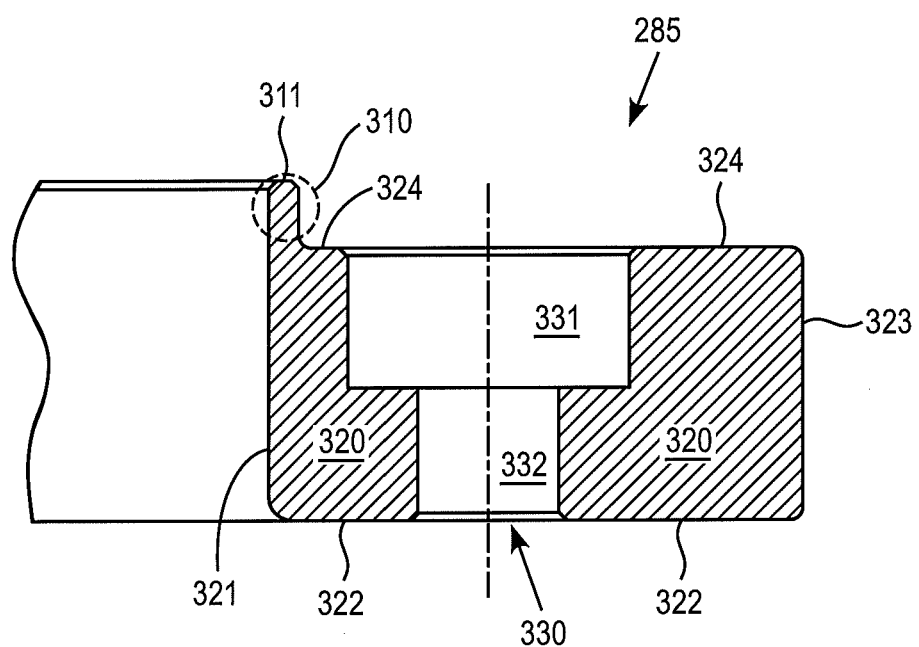
FIG. 4 shows a cross sectional view through the line A in FIG. 3.

A preferred embodiment of the dielectric coupling ring is shown in FIGS. 3 and 4. The dielectric coupling ring 285 consists of an annular body 320 and an annular projection 310. The dielectric ring 285 can optionally have an axially extending stepped hole 330 in the annular body 320, for receiving a pick-up pin.

With reference to FIG. 4, the dielectric coupling ring 285 has an inner cylindrical surface 321 with a diameter of 11.6 to 11.7 inches and a height of 0.49 to 0.50 inch; an outer cylindrical surface 323 with a diameter of 13.2 to 13.3 inches, a height of 0.39 to 0.40 inch and concentric with the inner cylindrical surface 321; a lower surface 322 perpendicular to a center axis of the outer cylindrical surface 323 and extending from a lower periphery of the outer cylindrical surface 323 to a lower periphery of the inner cylindrical surface 321; an upper surface 324 perpendicular to the center axis of the outer cylindrical surface 323 and extending inwardly from an upper periphery of the outer cylindrical surface 323; an annular projection 310 extending outwardly from an upper periphery of the inner cylindrical surface 321 and upwardly from an inner periphery of the upper surface 324; the annular projection 310 having a height of 0.09 to 0.11 inch and a width of 0.04 to 0.05 inch.

Upper edges of the annular projection 310 have 45° chamfers of at most 0.01 inch wide. All other edges of the dielectric ring 285 can be rounded to suitable radii (such as 0.01, 0.02 and 0.05 inch). An optional stepped hole 330 consists of an upper cylindrical void 331 and a lower cylindrical void 332 concentric with the upper cylindrical void 331. A center axis of the voids 331 and 332 is parallel to the center axis of the dielectric coupling ring 285 and located at a radial distance of 6.1 to 6.2 inches from the center axis of the dielectric coupling ring 285. The upper cylindrical void 331 has a diameter of 0.40 to 0.45 inch and a depth measured from the upper surface 324 of 0.20 to 0.21 inch. The lower cylindrical void 332 has a diameter of 0.20 to 0.25 inch and a depth measured from the lower surface 322 of 0.18 to 0.20 inch. The edge of the stepped hole 330 and the upper surface 324 and the edge of the stepped hole 330 and the lower surface 322 have 45° chamfers of about 0.01 inch wide.

To minimize particulate contamination originating from the coupling ring 285, exposed surfaces of the coupling ring 285 can be optionally etched by 20 wt % hydrofluoric acid (HF) for about 60 minutes at room temperature.

Figure 5:
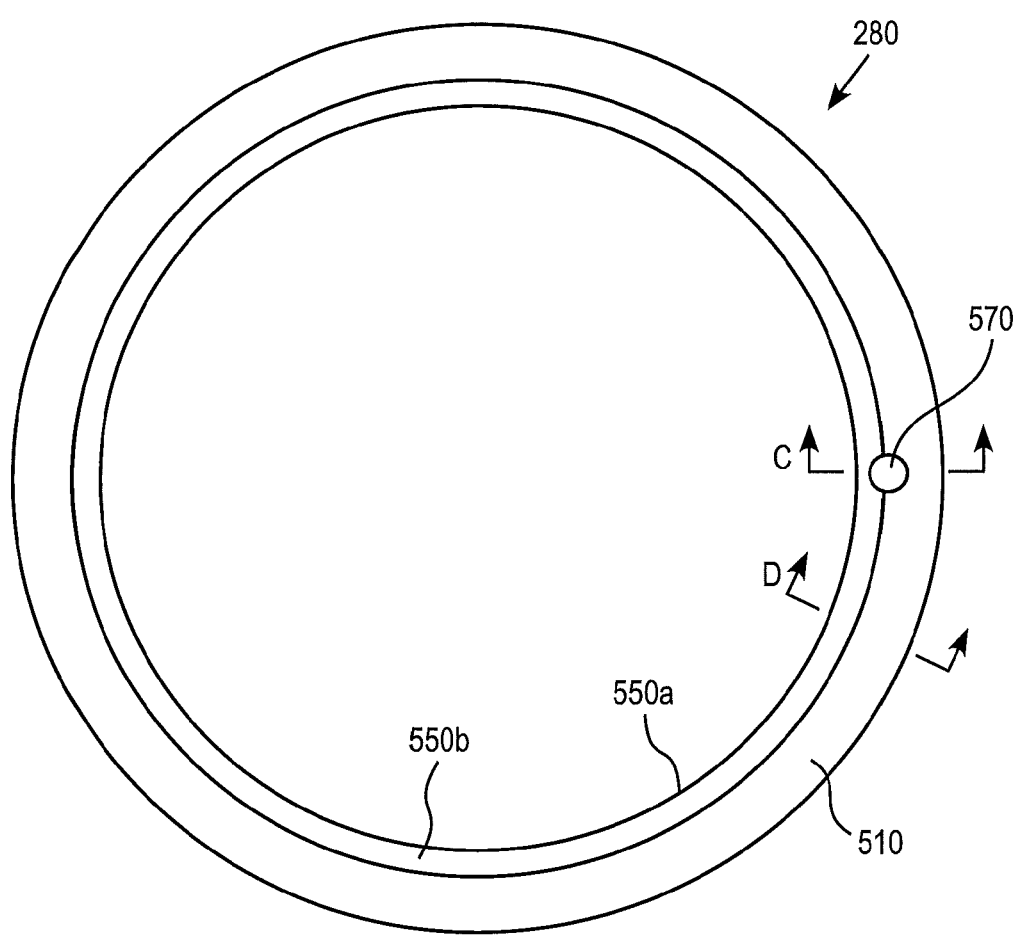
FIG. 5 shows a top view of a conductive edge ring as shown in FIG. 2A.
Figure 6:
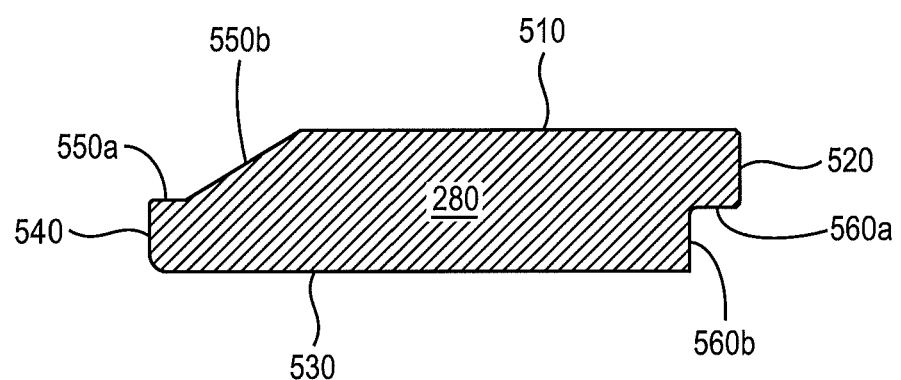
FIG. 6 shows a cross sectional view through the line D in FIG. 5.
Figure 7:
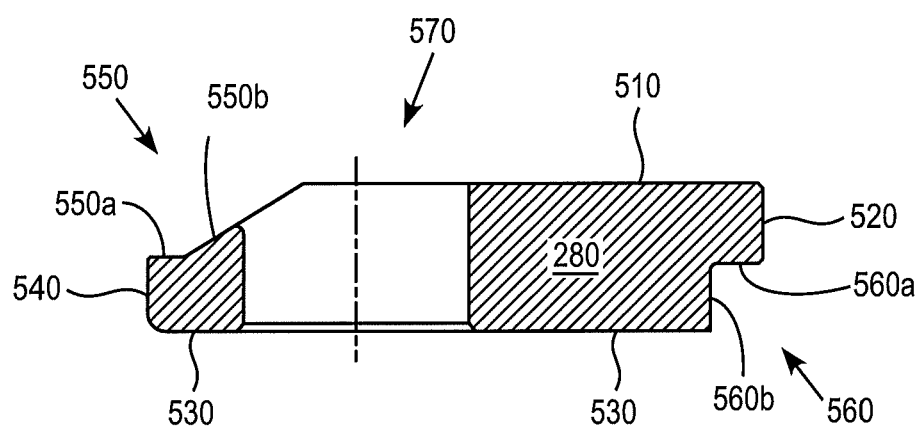
FIG. 7 shows a cross sectional view through the line C in FIG. 5.

A preferred embodiment of the conductive edge ring is shown in FIGS. 5-7. The conductive edge ring 280 has an inner cylindrical surface 540 with a diameter of 11.7 to 11.8 inches and a height of 0.095 to 0.105 inch, an outer cylindrical surface 520 with a diameter of 13.35 to 13.45 inches and a height of 0.10 to 0.11 inch and concentric with the inner cylindrical surface 540, a lower surface 530 perpendicular to a center axis of the inner cylindrical surface 540 and extending outwardly 0.7 to 0.8 inch from a lower periphery of the inner cylindrical surface 540, an upper surface 510 perpendicular to a center axis of the outer cylindrical surface 520 and extending inwardly 0.5 to 0.6 inch from an upper periphery of the outer cylindrical surface 520, a first annular surface 550a with a width of 0.04 to 0.05 inch, perpendicular to the center axis of the inner cylindrical surface 540 and extending outwardly from an upper periphery of the inner cylindrical surface 540, a truncated conical surface 550b with an opening angle of 119° to 121° and a width of 0.20 to 0.22 inch, concentric with the inner cylindrical surface 540 and extending upwardly and outwardly from an outer periphery of the first annular surface 550a to an inner periphery of the upper surface 510, a second annular surface 560a with a width of 0.065 to 0.075 inch, perpendicular to the center axis of the outer cylindrical surface 520 and extending inwardly from a lower periphery of the outer cylindrical surface 520, a cylindrical surface 560b with a height of 0.085 to 0.095 inch, concentric with the outer cylindrical surface 520 and extending from an inner periphery of the second annular surface 560a to an outer periphery of the lower surface 530. The conductive edge ring 280 can optionally have a through hole 570 with a uniform diameter of 0.29 to 0.31 inch, for receiving a pick-up pin. A center axis of the through hole 570 is parallel to the center axis of the outer cylindrical surface 520 and located at a radial distance of 6.1 to 6.2 inches from the center axis of the outer cylindrical surface 520.

All edges on the conductive edge ring 280 can be rounded to suitable radii such as 0.005, 0.01, 0.02 and 0.03 inch. To minimize particulate contamination originating from the conductive ring 280, the conductive edge ring 280 can be optionally etched by acid.

Referring to FIGS. 2A, 3-7, when installed on the substrate support 250, the conductive edge ring 280 and the coupling ring 285 are concentric. The through hole 570 and the stepped hole 330, if provided, are concentric. Thickness of the conductive edge ring 280 between the surfaces 550a and 530 is substantially equal to the height of the annular projection 310 (between the surfaces 311 and 324). The conductive edge ring 280 is preferably made of electrically conductive materials, such as boron-doped single crystalline silicon.

In a preferred embodiment, the inner cylindrical surface 540 of the conductive edge ring 280 contacts or is located close to the projection 310 of the dielectric coupling ring 285, and the inner cylindrical surface 321 of the dielectric coupling ring 285 contacts or is located close to an outer periphery of the substrate support 250. As used herein, "close to" means that a gap (e.g., an annular gap) between the conductive edge ring 280 and the dielectric coupling ring 285 or a gap between the dielectric coupling ring 285 and the substrate support 250 is less than about 0.01 inch, more preferably less than about 0.005 in.

The surface 311 of the dielectric coupling ring 285 and the surface 550a of the conductive edge ring 280 are preferably positioned in close proximity to the underside of the substrate 210. The surface 311 and the surface 550a are preferably substantially co-planar and configured to underlie the portion of the substrate 210 that overhangs the substrate support surface 255.

Materials suitable for use as the dielectric coupling ring 285 include ceramic materials such as silicon oxide (e.g., quartz) or aluminum oxide, and polymer materials such as Vespel® and Kapton® or the like. The dielectric coupling ring 285 is preferably made from quartz.

As shown in the FIG. 2B embodiment, a dielectric coupling ring 295 is supported on the flange surface 260 of the substrate support 250, with or without mechanical or adhesive fastening. A conductive edge ring 290 is supported on an upper surface of the dielectric coupling ring 295. The substrate 210 can be supported/clamped on the support surface 255. In order to reduce exposure of the substrate support 250 to the ions/reactive species in the plasma, the substrate support 250 is preferably sized such that the substrate 210 overhangs the substrate support surface 255 and overlie at least a radially inner portion 291 of the conductive edge ring 290.

The conductive edge ring 290 can be made from a semiconducting or electrically conductive material such as silicon (e.g., single crystal silicon or polycrystalline silicon) or silicon carbide (e.g., chemical vapor deposited silicon carbide). Due to direct exposure to the plasma, the conductive edge ring 290 is preferably made from high purity materials. The conductive edge ring 290 may be electrically floating or may be electrically coupled to a DC ground.

Figure 8:
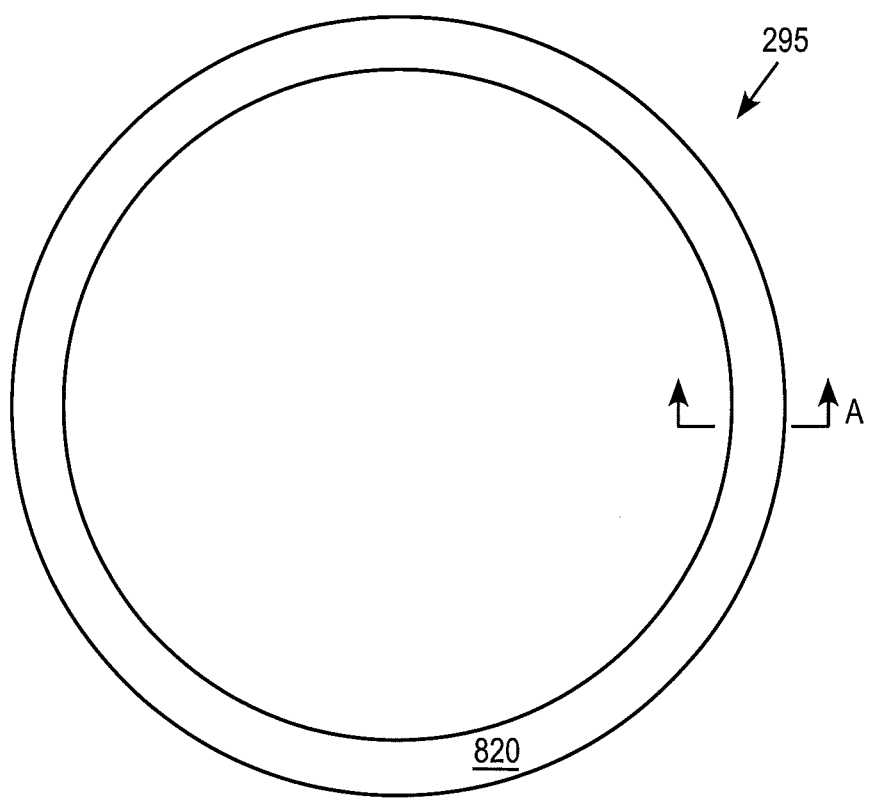
FIG. 8 shows a top view of a dielectric coupling ring as shown in FIG. 2B.
Figure 9:
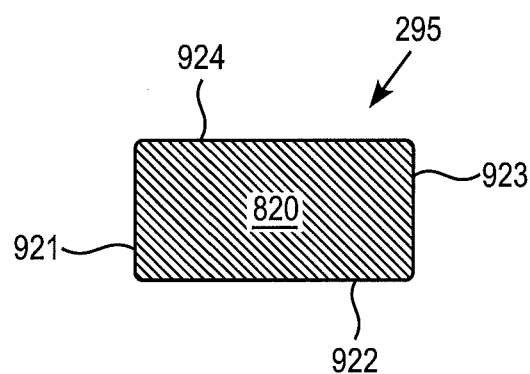
FIG. 9 shows a cross sectional view through the line A in FIG. 8.

A preferred embodiment of the dielectric coupling ring is shown in FIGS. 8 and 9. The dielectric coupling ring 295 consists of an annular body 820.

With reference to FIG. 9, the dielectric coupling ring 295 has an inner cylindrical surface 921 with a diameter of 11.6 to 11.7 inches and a height of 0.39 to 0.40 inch; an outer cylindrical surface 923 with a diameter of 13.2 to 13.3 inches, a height of 0.39 to 0.40 inch and concentric with the inner cylindrical surface 921; a lower surface 922 perpendicular to a center axis of the outer cylindrical surface 923 and extending from a lower periphery of the outer cylindrical surface 923 to a lower periphery of the inner cylindrical surface 921; an upper surface 924 perpendicular to the center axis of the outer cylindrical surface 923 and extending from an upper periphery of the outer cylindrical surface 923 to an upper periphery of the inner cylindrical surface 921.

All edges of the dielectric ring 295 can be rounded to suitable radii (such as 0.01, 0.02, 0.035, 0.04 and 0.05 inch). Preferably, the edge between the upper surface 924 and the inner cylindrical surface 921 is rounded to a radius of 0.04 inch; the edge between the lower surface 922 and the inner cylindrical surface 921 is rounded to a radius of 0.035 inch; the edge between the lower surface 922 and the outer cylindrical surface 923 is rounded to a radius of 0.02 inch; and the edge between the upper surface 924 and the outer cylindrical surface 923 is rounded to a radius of 0.02 inch.

Figure 10:
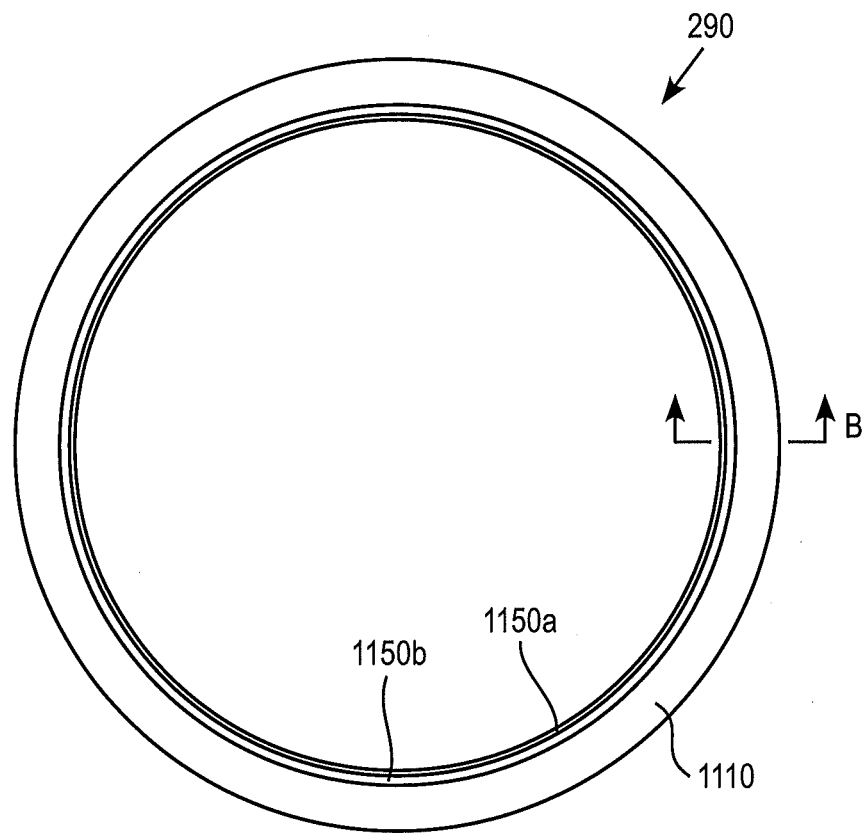
FIG. 10 shows a top view of a conductive edge ring as shown in FIG. 2B.
Figure 11:
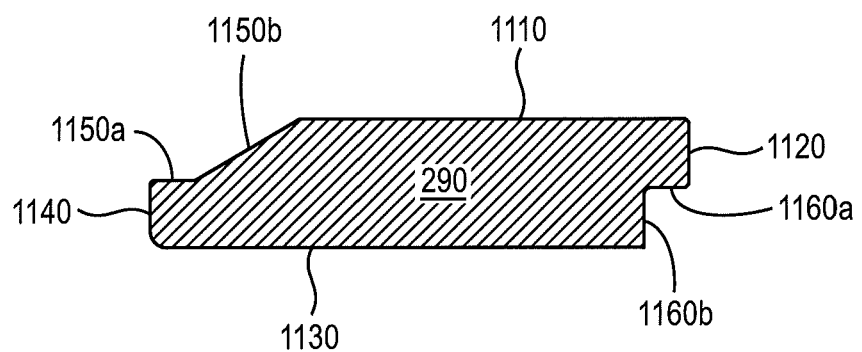
FIG. 11 shows a cross sectional view through the line B in FIG. 10.

A preferred embodiment of the conductive edge ring is shown in FIGS. 10-11. The conductive edge ring 290 has an inner cylindrical surface 1140 with a diameter of 11.6 to 11.7 inches and a height of 0:095 to 0.105 inch, an outer cylindrical surface 1120 with a diameter of 13.35 to 13.45 inches and a height of 0.10 to 0.11 inch and concentric with the inner cylindrical surface 1140, a lower surface 1130 perpendicular to a center axis of the inner cylindrical surface 1140 and extending outwardly 0.8 to 0.9 inch from a lower periphery of the inner cylindrical surface 1140, an upper surface 1110 perpendicular to a center axis of the outer cylindrical surface 1120 and extending inwardly 0.5 to 0.6 inch from an upper periphery of the outer cylindrical surface 1120, a first annular surface 1150*a* with a width of 0.09 to 0.10 inch, perpendicular to the center axis of the inner cylindrical surface 1140 and extending outwardly from an upper periphery of the inner cylindrical surface 1140, a truncated conical surface 1150*b* with an opening angle of 119° to 121° and a width of 0.20 to 0.22 inch, concentric with the inner cylindrical surface 1140 and extending upwardly and outwardly from an outer periphery of the first annular surface 1150*a* to an inner periphery of the upper surface 1110, a second annular surface 1160*a* with a width of 0.065 to 0.075 inch, perpendicular to the center axis of the outer cylindrical surface 1120 and extending inwardly from a lower periphery of the outer cylindrical surface 1120, a cylindrical surface 1160*b* with a height of 0.085 to 0.095 inch, concentric with the outer cylindrical surface 1120 and extending from an inner periphery of the second annular surface 1160*a* to an outer periphery of the lower surface 1130. All edges on the conductive edge ring 290 can be rounded to suitable radii such as 0.005, 0.01, 0.02 and 0.03 inch.

Referring to FIGS. 2B, 8-11, when installed on the substrate support 250, the conductive edge ring 290 and the coupling ring 295 are concentric. The conductive edge ring 290 is preferably made of electrically conductive materials, such as boron-doped single crystalline silicon.

In a preferred embodiment, the inner cylindrical surface 1140 of the conductive edge ring 290 contacts or is located close to an outer periphery of the substrate support 250. As used herein, "close to" means that a gap (e.g., an annular gap) between the conductive edge ring 290 and the substrate support 250 is less than about 0.01 inch, more preferably less than about 0.005 in.

Materials suitable for use as the dielectric coupling ring 295 include ceramic materials such as silicon oxide (e.g., quartz) or aluminum oxide, and polymer materials such as Vespel® and Kapton® or the like. The dielectric coupling ring 295 is preferably made from aluminum oxide.

While the dielectric coupling ring and the conductive edge ring have been described in detail with reference to specific embodiments thereof, it will be apparent to those skilled in the art that various changes and modifications can be made, and equivalents employed, without departing from the scope of the appended claims.

We claim:

1. A component of an edge ring assembly used in a plasma etching chamber wherein a dielectric coupling ring is adapted to surround a substrate support in the plasma etching chamber and a conductive edge ring is adapted to surround and be supported on the dielectric coupling ring such that a substrate supported on the substrate support overhangs a portion of the conductive edge ring, the component comprising:
the dielectric coupling ring having an inner cylindrical surface with a diameter of 11.6 to 11.7 inches and a height of 0.49 to 0.50 inch, an outer cylindrical surface with a diameter of 13.2 to 13.3 inches, a height of 0.39 to 0.40 inch and concentric with the inner cylindrical surface, a lower surface perpendicular to a center axis of the outer cylindrical surface and extending from a lower periphery of the outer cylindrical surface to a lower periphery of the inner cylindrical surface, an upper surface perpendicular to the center axis of the outer cylindrical surface and extending inwardly from an upper periphery of the outer cylindrical surface, an annular projection extending outwardly from an upper periphery of the inner cylindrical surface and upwardly from an inner periphery of the upper surface, the annular projection having a height of 0.09 to 0.11 inch and a width of 0.04 to 0.05 inch; and/or the conductive edge ring having an inner cylindrical surface with a diameter of 11.7 to 11.8 inches and a height of 0.095 to 0.105 inch, an outer cylindrical surface with a diameter of 13.35 to 13.45 inches and a height of 0.10 to 0.11 inch and concentric with the inner cylindrical surface, a lower surface perpendicular to a center axis of the inner cylindrical surface and extending outwardly 0.7 to 0.8 inch from a lower periphery of the inner cylindrical surface, an upper surface perpendicular to a center axis of the outer cylindrical surface and extending inwardly 0.5 to 0.6 inch from an upper periphery of the outer cylindrical surface, a first annular surface with a width of 0.04 to 0.05 inch, perpendicular to the center axis of the inner cylindrical surface and extending outwardly from an upper periphery of the inner cylindrical surface, a truncated conical surface with an opening angle of 119° to 121° and a width of 0.2 to 0.22 inch, concentric with the inner cylindrical surface and extending upwardly and outwardly from an outer periphery of the first annular surface to an inner periphery of the upper surface, a second annular surface with a width of 0.06 to 0.075 inch, perpendicular to the center axis of the outer cylindrical surface and extending inwardly from a lower periphery of the outer cylindrical surface, a cylindrical surface with a height of 0.085 to 0.095 inch, concentric with the outer cylindrical surface and extending from an inner periphery of the second annular surface to an outer periphery of the lower surface.

2. The component of claim 1, comprising the dielectric coupling ring wherein the dielectric coupling ring further comprises a stepped through hole between the upper surface and the lower surface and consisting of an upper cylindrical void and a lower cylindrical void concentric with the upper cylindrical void;
a center axis of the upper cylindrical void and lower cylindrical void being parallel to a center axis of the dielectric coupling ring and located at a radial distance of 6.1 to 6.2 inches from the center axis of the dielectric coupling ring;
the upper cylindrical void having a diameter of 0.40 to 0.45 inch and a depth of 0.20 to 0.21 inch;
the lower cylindrical void having a diameter of 0.20 to 0.25 inch and a depth of about 0.18 to 0.20 inch.

3. The component of claim 1, comprising the dielectric coupling ring, the dielectric coupling ring consisting of quartz or a ceramic material or a polymer material.

4. The component of claim 1, comprising the conductive edge ring wherein the conductive edge ring further comprises a through hole with a uniform diameter of 0.29 to 0.31 inch, wherein a center axis of the through hole is parallel to a center axis of the conductive edge ring and located at a radial distance of 6.1 to 6.2 inches from the center axis of the conductive edge ring.

5. The component of claim 1, comprising the conductive edge ring, the conductive edge ring consisting of boron-doped single crystalline silicon.

6. The component of claim 1, wherein the first annular surface of the conductive edge ring is coextensive with an upper surface of the projection of the dielectric coupling ring when the conductive edge ring is mounted on the dielectric coupling ring.

\* \* \* \* \*